US010295581B2

(12) United States Patent
Fu et al.

(10) Patent No.: US 10,295,581 B2
(45) Date of Patent: May 21, 2019

(54) VOLTAGE SENSOR-LESS POSITION DETECTION IN AN ACTIVE FRONT END

(71) Applicant: Deere & Company, Moline, IL (US)

(72) Inventors: Tianjun Fu, Fargo, ND (US); Long Wu, Fargo, ND (US); Kent Wanner, Moline, IL (US); Jason Dickherber, Moline, IL (US); Chris J. Tremel, West Fargo, ND (US)

(73) Assignee: Deere & Company, Moline, IL (US)

( * ) Notice: Subject to any disclaimer, the term of this patent is extended or adjusted under 35 U.S.C. 154(b) by 0 days.

(21) Appl. No.: 15/915,553

(22) Filed: Mar. 8, 2018

(65) Prior Publication Data

US 2019/0113553 A1 Apr. 18, 2019

Related U.S. Application Data

(63) Continuation-in-part of application No. 15/783,057, filed on Oct. 13, 2017.

(51) Int. Cl.
*G01R 25/00* (2006.01)
*H02P 27/08* (2006.01)
*H02M 1/08* (2006.01)
*G01R 25/02* (2006.01)
*G05B 6/02* (2006.01)
*G01R 19/25* (2006.01)
*H02M 7/5395* (2006.01)

(52) U.S. Cl.
CPC ....... *G01R 25/005* (2013.01); *G01R 19/2503* (2013.01); *G01R 25/02* (2013.01); *G05B 6/02* (2013.01); *H02M 1/08* (2013.01); *H02M 7/5395* (2013.01)

(58) Field of Classification Search
CPC .. G01R 25/005; G01R 25/02; G01R 19/2503; G05B 6/02; H02M 7/5395; H02M 1/08
USPC .......................... 363/132; 290/44, 43, 54, 55
See application file for complete search history.

(56) References Cited

U.S. PATENT DOCUMENTS

| 7,940,537 | B2 | 5/2011 | Abolhassani et al. |
| 8,030,791 | B2* | 10/2011 | Lang ................... H02M 5/4505 290/43 |
| 8,350,397 | B2* | 1/2013 | Lang ................... H02M 5/4505 290/44 |

(Continued)

OTHER PUBLICATIONS

STIC search report from EIC 2800 searcher Benjamin Martin dated Aug. 23,2018.*

(Continued)

*Primary Examiner* — Timothy J. Dole
*Assistant Examiner* — Htet Z Kyaw
(74) *Attorney, Agent, or Firm* — Harness, Dickey & Pierce, P.L.C.

(57) ABSTRACT

A controller including a memory having computer-readable instructions stored therein; and a processor configured to execute the computer-readable instructions to: estimate a synthesized grid voltage vector angle at a terminal of an alternating current (AC) grid based on at least an adjusted angle, to generate Pulse Width Modulation (PWM) signals to control power switches of the AFE inverter based on at least the synthesized grid voltage vector angle, and to control the AFE inverter to exchange power between the AC grid and a load based on the PWM signals.

20 Claims, 12 Drawing Sheets

(56) References Cited

U.S. PATENT DOCUMENTS

| | | | |
|---|---|---|---|
| 8,395,360 B2* | 3/2013 | Tripathi | F03D 7/0272 322/29 |
| 8,704,571 B2 | 4/2014 | Kerkman et al. | |
| 9,385,638 B2 | 7/2016 | Simms | |
| 9,722,520 B2* | 8/2017 | Tripathi | F03D 7/0272 |
| 2003/0030404 A1* | 2/2003 | Iwaji | H02P 6/18 318/700 |
| 2004/0183498 A1* | 9/2004 | Iwaji | H02P 21/00 318/801 |
| 2008/0007199 A1* | 1/2008 | Kasaoka | H02P 21/0089 318/807 |
| 2009/0021020 A1* | 1/2009 | Andresen | H02P 9/305 290/55 |
| 2010/0066283 A1* | 3/2010 | Kitanaka | B60L 11/1803 318/400.02 |
| 2011/0133678 A1* | 6/2011 | Tomigashi | H02P 27/08 318/400.04 |
| 2011/0254516 A1 | 10/2011 | Ren et al. | |
| 2012/0081061 A1 | 4/2012 | Zargari et al. | |
| 2012/0268081 A1 | 10/2012 | Tripathi et al. | |
| 2013/0033907 A1 | 2/2013 | Zhou et al. | |
| 2013/0147442 A1 | 6/2013 | Tripathi et al. | |
| 2013/0208519 A1 | 8/2013 | Yamamoto et al. | |
| 2014/0225545 A1 | 8/2014 | Becerra et al. | |
| 2014/0362617 A1 | 12/2014 | Li | |
| 2014/0362623 A1 | 12/2014 | Farkas | |
| 2015/0077067 A1 | 3/2015 | Kanjiya et al. | |
| 2015/0236632 A1 | 8/2015 | Marohl et al. | |
| 2015/0316906 A1 | 11/2015 | Xia et al. | |
| 2016/0144871 A1 | 5/2016 | Jalla | |
| 2016/0173012 A1 | 8/2016 | Nondahl et al. | |
| 2016/0268916 A1 | 9/2016 | Ramsay et al. | |
| 2016/0282392 A1 | 9/2016 | Lee et al. | |
| 2016/0315501 A1 | 10/2016 | Long et al. | |
| 2016/0329714 A1 | 11/2016 | Li et al. | |
| 2017/0133922 A1* | 5/2017 | Venkataramanan | H02M 1/143 |
| 2017/0229857 A1* | 8/2017 | Kral | H02H 7/28 |
| 2017/0272023 A1 | 9/2017 | Ahmed et al. | |
| 2017/0366082 A1* | 12/2017 | Liu | H02P 7/04 |
| 2018/0091075 A1* | 3/2018 | Musil | H02P 6/28 |
| 2018/0145602 A1 | 5/2018 | Wei et al. | |

OTHER PUBLICATIONS

STIC search report fro EIC 2800 searcher Mesfin Getaneh dated Jun. 21, 2018.*
U.S. Non-Final Office Action dated Aug. 9, 2018 for U.S. Appl. No. 15/783,057.
Final Office Action dated Oct. 19, 2018 for U.S. Appl. No. 15/783,057.
STIC search report from EIC 2800 searcher Samir Patel dated Aug. 22, 2018 for claim 3.
STIC search report from EIC 2800 searcher Samir Patel dated Aug. 23, 2018 for claim 5.
Notice of Allowance dated Nov. 30, 2018 in U.S. Appl. No. 15/783,057.
Extended European Search Report dated Mar. 8, 2019 for EP Application No. 18198514.4.
Yong Yang et al., "Research on Grid-Connected Inverter Based on Virtual Grid Voltage flux and Pll Without Grid Voltage Sensors", IEEE 6th International Power Electronics and Motion Control Conference, 2009: IPEMC '09; Wuhan, China, May 17-20, 2009, IEEE, Piscataway, NJ, USA, May 17, 2009, pp. 696-701, XP031535196, DOI: 10.1109/IPEMC.2009.5157474, ISBN: 978-1-4244-3556-2.
Bradshaw J. et al., "Bit stream implementation of a phase-locked loop", The Institution of Engineering and Technology, JOU, vol. 4, No. 1, Jan. 4, 2011, pp. 11-20, XP006037470, ISSN: 1755-4543, DOI: 10.1049/IET-PEL:20100009.
Jain Prashant et al., "Hybrid Phase Locked Loop for Controlling Centralized Inverters in Large Solar Photovoltaic Power Plants", 2016 IEEE International Conference on Power Electronics, Drives and Energy Systems (PEDES), IEEE, Dec. 14, 2016, pp. 1-7, XP033089959, DOI: 10.1109/PEDES.2016.7914349.

* cited by examiner

Fig. 11A

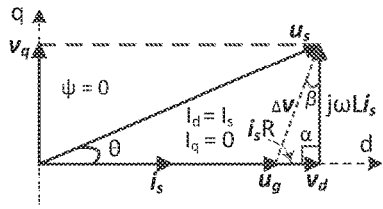

A1. $I_S > 0$ & |Power Factor| = 1
(Supplying power)

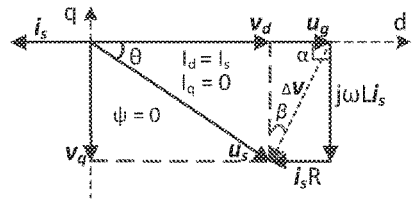

A2. $I_S < 0$ & |Power Factor| = 1
(Consuming power)

A. AFE inverter supplies/consumes power at unity power factor

Fig. 11B

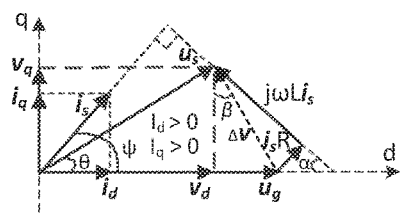

B1. $I_S > 0$ & Power Factor > 0 ($i_s$ leads $u_g$)

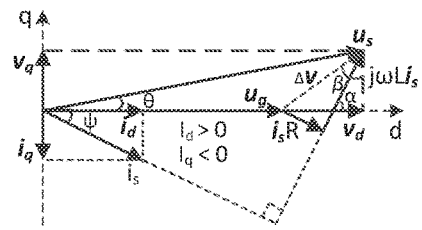

B2. $I_S > 0$ & Power Factor < 0 ($i_s$ lags $u_g$)

B. AFE inverter supplies power to the grid (Is > 0)

Fig. 11C

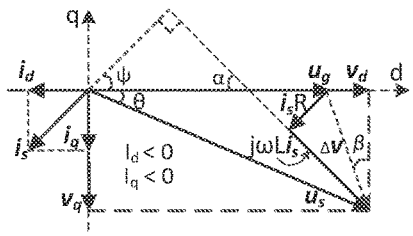

C1. $I_S < 0$ & Power Factor > 0 (-$i_s$ leads $u_g$)

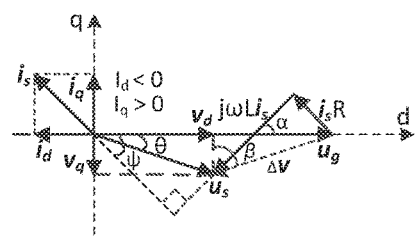

C2. $I_S < 0$ & Power Factor < 0 (-$i_s$ lags $u_g$)

C. AFE inverter consumes power from the grid (Is < 0)

VOLTAGE SENSOR-LESS POSITION DETECTION IN AN ACTIVE FRONT END

CROSS-REFERENCE TO RELATED APPLICATION

This Application is a Continuation-in-Part of U.S. patent application Ser. No. 15/783,057 filed on Oct. 13, 2017, the entire contents of which are incorporated herein by reference.

BACKGROUND

1. Field

Example embodiments relate generally to an apparatus configured to detect an angle of a grid voltage vector at a terminal of an alternating current (AC) grid, a system and/or a method of performing same.

2. Related Art

In an Active Front End (AFE) control system, a phase locked loop (PLL) based control method is often used to detect an angle of a grid voltage vector at a terminal of an alternating current (AC) based on grid line-to-line voltage information. Conventionally, in order to detect the angle of the grid voltage vector of the AC grid, the grid line-to-line voltage information may need to be sensed first using external voltage sensors attached to terminals of the AC grid.

SUMMARY

Some example embodiments relate to a controller and/or a method of generating Pulse Width Modulation (PWM) signals for power switches of an Active Front End (AFE) inverter.

In some example embodiments, the controller may include a memory having computer-readable instructions stored therein; and a processor configured to execute the computer-readable instructions: to estimate a synthesized grid voltage vector angle at a terminal of an alternating current (AC) grid based on at least an adjusted angle, and to generate Pulse Width Modulation (PWM) signals to control power switches of the AFE inverter based on at least the synthesized grid voltage vector angle, and to control the AFE inverter to exchange power between the AC grid and a load based on the PWM signals. For example, the adjusted angle may represent a shift in phase angle between an Active Front End (AFE) inverter terminal voltage vector angle at a terminal of an AFE inverter and the synthesized grid voltage vector angle. Further, the processor may estimate the synthesized grid voltage vector angle based on at least the adjusted angle such that the synthesized grid voltage vector angle represents an angle associated with a voltage vector of the terminal of the AC grid.

BRIEF DESCRIPTION OF THE DRAWINGS

At least some example embodiments will become more fully understood from the detailed description provided below and the accompanying drawings, wherein like elements are represented by like reference numerals, which are given by way of illustration only and thus are not limiting of example embodiments and wherein:

FIGS. 11A to 11C are vector diagrams illustrating current and voltage vectors in a direct-quadrature (dq) rotating reference frame according to some example embodiments.

DETAILED DESCRIPTION

Figure 1:
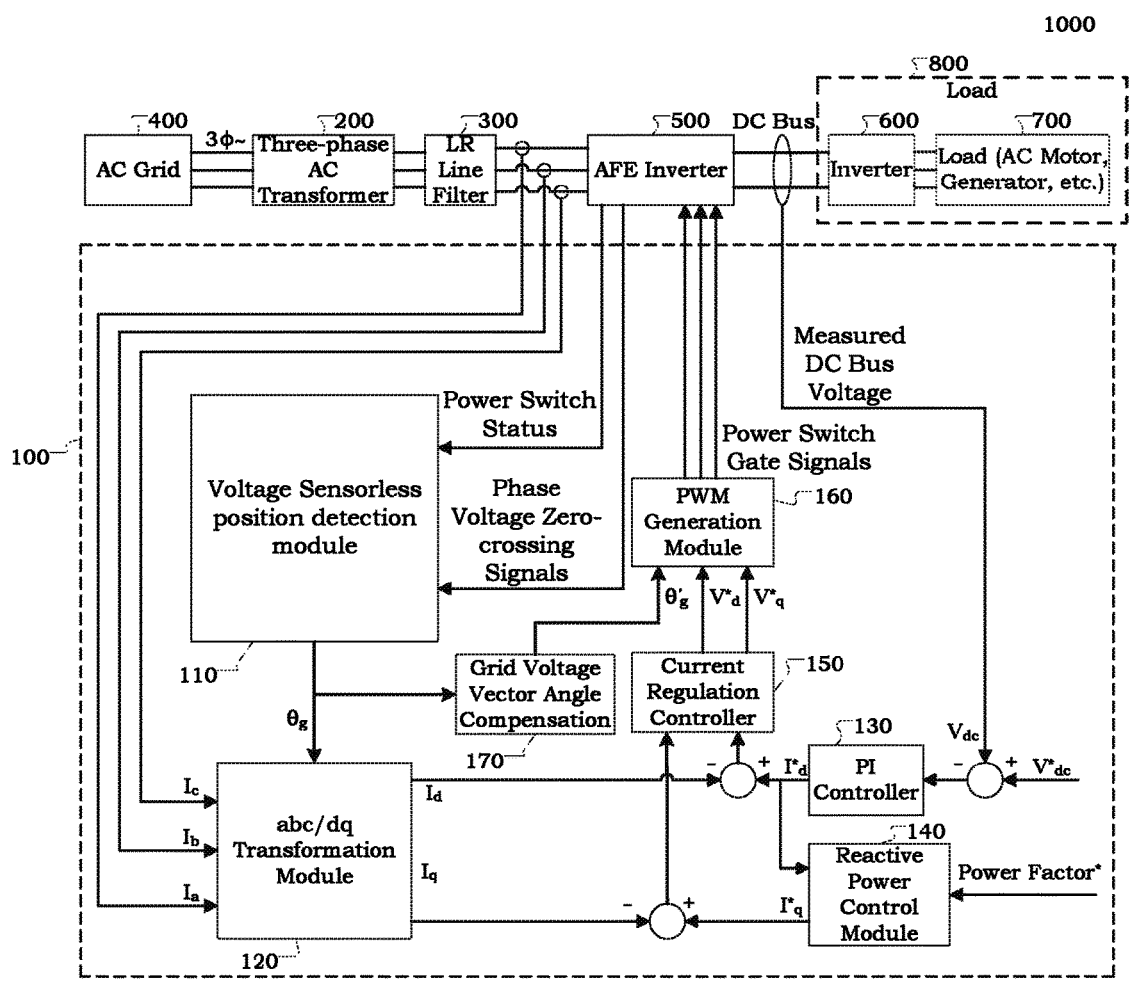
FIG. 1 is a block diagram of a system for controlling a load according to some example embodiments.

Some example embodiments will now be described more fully with reference to the accompanying drawings in which some example embodiments are illustrated.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the claims. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of example embodiments and corresponding detailed description are presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the following description, illustrative embodiments will be described with reference to acts and symbolic representations of operations (e.g., in the form of flowcharts) that may be implemented as program modules or functional processes including routines, programs, objects, components, data structures, etc., that perform particular tasks or implement particular abstract data types and may be implemented using existing hardware. Such existing hardware may include one or more Central Processing Units (CPUs), digital signal processors (DSPs), application-specific-integrated-circuits, field programmable gate arrays (FPGAs) computers or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores the code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Further, at least one embodiment of the invention relates to a non-transitory computer-readable storage medium comprising electronically readable control information stored thereon, configured in such that when the storage medium is used in a controller of a magnetic resonance device, at least one embodiment of the method is carried out.

Even further, any of the aforementioned methods may be embodied in the form of a program. The program may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The transmission medium may be twisted wire pairs, coaxial cable, optical fiber, or some other suitable transmission medium known to the art.

The example embodiments may have different forms and/or be combined, and should not be construed as being limited to the descriptions set forth herein.

In one or more example embodiments, a data processing system may estimate the grid input line-to-line voltage information directly from the AFE inverter terminals during an inverter self-sensing mode by estimating the inverter terminal voltage (e.g., voltage drops across the inverter switches and diodes) based on inverter gate drive signals, and subsequently estimating the angle of the composite voltage vector, which is constructed from the three-phase inverter terminal voltages, using the PLL based position detection method.

To precisely control the AFE system power factor at a grid input voltage terminal, the data processing system may compensate for a voltage drop across the impedance between the grid input voltage terminal and the AFE inverter terminals by converting the estimated inverter voltage vector angle from the inverter terminal voltages to the grid voltage vector angle corresponding to the voltage at the grid input terminals.

Figure 2:
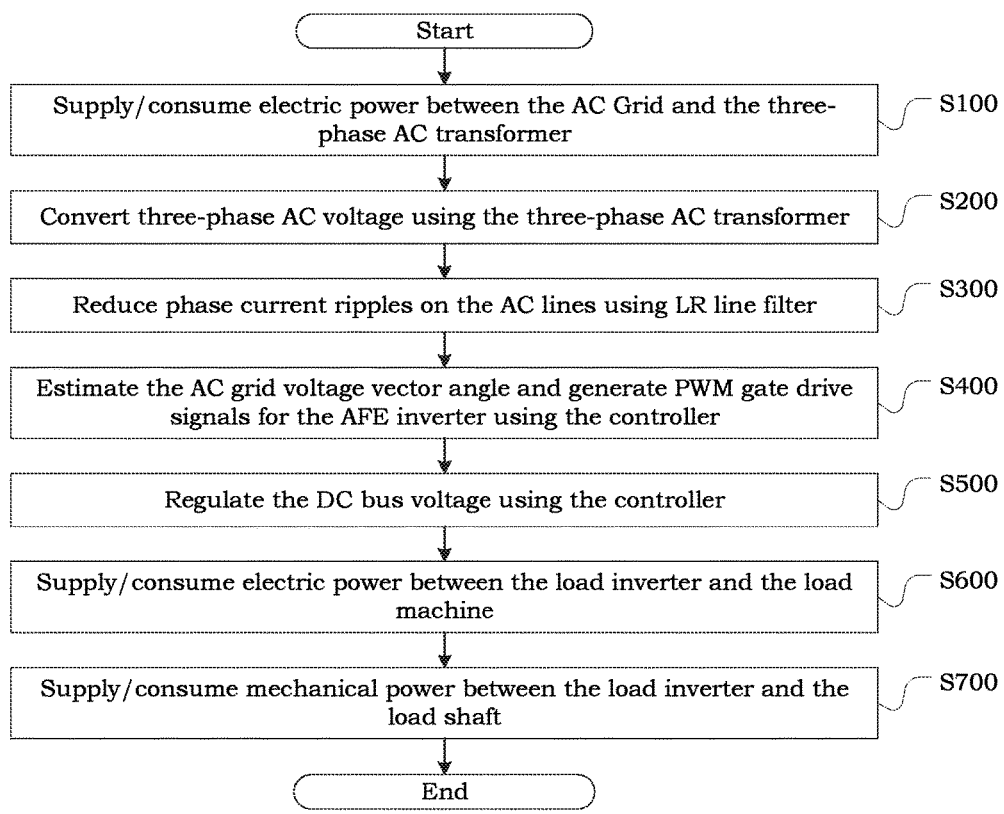
FIG. 2 illustrates a method of controlling a system based on voltage sensorless position detecting according to some example embodiments.

FIG. 1 is a block diagram of a system for controlling a load according to some example embodiments, and FIG. 2 illustrates a method of controlling the system according to some example embodiments.

Referring to FIGS. 1 and 2, a system 1000 may include a data processing system 100, such as a controller, an alternating current (AC) transformer 200 and an inductor resistor (LR) line filter 300 connected to an alternating current (AC) power grid 400, an active front end (AFE) inverter 500, and an AFE load 800. In some example embodiments, the AFE load 800 may include an inverter 600, and a load 700, such as an interior permanent magnet (IPM) motor.

The data processing system 100 may be, but not limited to, a processor, Central Processing Unit (CPU), a controller, an arithmetic logic unit (ALU), a digital signal processor, a microcomputer, a field programmable gate array (FPGA), an Application Specific Integrated Circuit (ASIC), a System-on-Chip (SoC), a programmable logic unit, a microprocessor, or any other device capable of performing operations in a defined manner. In an example embodiment, the data processing system 100 may include a processor and a memory to support storing, processing and execution of software instructions of one or more software modules.

As discussed below, the data processing system 100 may control the AFE inverter 500 based on signals received from the AFE inverter 500.

In some example embodiments, the processor of the data processing system 100 control power switches of an Active Front End (AFE) inverter by estimating a synthesized grid voltage vector angle at a terminal of an alternating current (AC) grid based on at least an adjusted angle, generating Pulse Width Modulation (PWM) signals based on at least the synthesized grid voltage vector angle, and controlling the AFE inverter to exchange power between the AC grid and a load based on the PWM signals.

In some example embodiments, the processor is configured to estimate the synthesized grid voltage vector angle at the terminal of the AC grid without using physical voltage sensors.

In some example embodiments, the shift in the phase angle is due to a voltage drop across an impedance of a filter between the terminal of the AFE inverter and the terminal of the AC grid such that the controller is configured to compensate for the voltage drop.

In some example embodiments, the adjusted angle represents a difference between the AFE inverter terminal voltage vector angle and the synthesized grid voltage vector angle.

In some example embodiments, the processor is configured to calculate the adjusted angle based on a d-axis voltage and a q-axis voltage, the d-axis voltage and the q-axis voltage representing a projection of the AFE inverter terminal voltage vector along a rotating dq-axis, the rotating dq-axis having a d-axis aligned with the synthesized grid voltage vector angle.

In some example embodiments, the processor is configured to calculate the adjusted angle by calculating an inverse tangent value of a quotient obtained by dividing the q-axis voltage over the d-axis voltage.

In some example embodiments, the filter is a line filter, and the processor is configured to calculate the d-axis voltage and the q-axis voltage based on a magnitude of grid voltage vector of the terminal of the AC grid, an intermediate angle, parameters of the line filter and a signed magnitude of an inverter phase current reference vector, the inverter phase current reference vector being constructed by a d-axis current reference and a q-axis current reference.

In some example embodiments, the AFE inverter is connected to the load via a DC bus, and the d-axis current reference is generated based on a difference between an actual DC bus voltage of the DC bus and a reference DC bus voltage, and the q-axis current reference is generated based on a AC grid terminal reference power factor.

In some example embodiments, the controller is configured to calculate the d-axis current reference by comparing, using a proportional-integral (PI) controller, the actual DC bus voltage of the DC bus and the reference DC bus voltage, calculate the q-axis current reference to achieve the AC grid terminal reference power factor at the terminal of the AC grid based on the d-axis current reference, and construct the inverter phase current reference vector based on the d-axis current reference and the q-axis current reference.

In some example embodiments, the parameters are impedance parameters of the line filter.

In some example embodiments, the processor is configured to calculate the intermediate angle based on a power factor angle, the impedance parameters of the line filter, and a polarity and a magnitude of the AC grid terminal reference power factor.

In some example embodiments, the processor is configured to calculate the power factor angle by calculating an inverse cosine value of an absolute value of the magnitude of the AC grid terminal reference power factor.

In some example embodiments, the AFE inverter terminal voltage vector angle includes a first AFE inverter terminal voltage vector angle and a second AFE inverter terminal voltage vector angle, the first AFE inverter terminal voltage vector angle being an angle associated with the voltage vector of the terminal of the AFE inverter at an initial time and the second AFE inverter terminal voltage vector angle being an angle associated with the voltage vector of the terminal of the AFE inverter at a second time subsequent to the initial time, and the processor is configured to estimate the synthesized grid voltage vector angle by, estimating the first AFE inverter terminal voltage vector angle when the AFE inverter is disabled, estimating a terminal voltage of the AFE inverter when the AFE inverter is enabled, the terminal voltage of the AFE inverter being a voltage of the terminal of the AFE inverter, determining the second AFE inverter terminal voltage vector angle when the AFE inverter is enabled, and estimating the synthesized grid voltage vector angle based on the adjusted angle and the second AFE inverter terminal voltage vector angle.

In some example embodiments, the processor is configured to estimate the second AFE inverter terminal voltage vector angle by, initializing a phase locking loop (PLL) using the first AFE inverter terminal voltage vector angle when the AFE inverter is disabled, and running the phase locking loop (PLL) using 3-phase line-to-neutral voltages of the terminal of the AFE inverter when the AFE inverter is enabled.

In some example embodiments, the processor is configured to estimate the second AFE inverter terminal voltage vector angle by running the PLL to align the second AFE inverter terminal voltage vector angle with a d-axis of a rotating dq-axis associated with the PLL.

In some example embodiments, when the AFE inverter is enabled, the processor is configured to estimate the second AFE inverter terminal voltage vector angle by running the PLL to continually, calculate a position error between the second AFE inverter terminal voltage vector angle and the d-axis associated with the PLL, calculate an angular frequency of the second AFE inverter terminal voltage vector angle by using a PI controller to regulate the position error, and estimate the second AFE inverter terminal voltage vector angle by integrating the angular frequency.

In some example embodiments, the processor is configured to compensate for the synthesized grid voltage vector angle by compensating for a time delay associated with digital processing to generate a compensated synthesized grid voltage vector angle, wherein the controller is configured to generate the PWM signals to control the power switches of the AFE inverter based on the compensated synthesized grid voltage vector angle.

In some example embodiments, the controller is configured to control the AFE inverter by defining a rotating dq reference frame based on the synthesized grid voltage vector angle such that a d-axis of the rotating dq reference frame is aligned with the synthesized grid voltage vector angle.

The data processing system 100 may include a voltage sensorless position detecting module 110, an abc/dq Transformation Module 120, a PI controller 130, a reactive power control module 140, a current regulation controller 150, and a PWM generation module 160. The voltage sensorless position detecting module 110 is shown in greater detail in FIG. 4.

As discussed below, the data processing system 100 may estimate a grid voltage vector angle $\theta_g$ without using physical voltage sensors attached to terminals of the AC grid 400, generate Pulse Width Modulation (PWM) signals to control power switches of the AFE inverter 500 based on the estimated grid voltage vector angle $\theta_g$, and operate the load 800 based on the PWM signals.

Referring to FIG. 2, in operation S100, the AC grid 400 may supply or consume AC power to maintain a stable DC bus voltage $V_{dc}$ at a DC bus. The DC bus electrically connects the AFE inverter 500 and the load inverter 600. The DC bus may be modeled as a capacitor that consumes the electrical power from the AC grid 400 and supplies the electrical power to the load 800. For example, the AC grid 400 may supply power to the AFE inverter 500 when the DC bus voltage $V_{dc}$ is less than the reference DC bus voltage $V_{dc}*$ due to the load 700 drawing more power from the DC bus than the AFE inverter 500 can supply. The AC grid 400 also may consume the AC power when the DC bus voltage $V_{dc}$ is greater than the reference DC bus voltage $V_{dc}*$ due to the load 700, which is running as a generator, supplying more power to the DC bus.

In operation S200, the three-phase AC transformer 200 may convert between high and low three-phase AC voltage.

In operation S300, the LR line filter 300 may filter out the current harmonics on lines. For example, the LR line filter 300 may be a pre-designed LR filter. The LR line filter 300 may be embodied as long cables connected between the AFE inverter 500 and the three-phase AC transformer 200, the length of which is determined based on the current harmonics on the lines.

In other example embodiments, the system 1000 may include a inductor-capacitor-inductor style filter or LCL filter (not shown) between the AFE inverter 500 and the three-phase AC transformer 200 rather than the LR filter 300, such that the data processing system 100 is configured to compensate for a phase shift due to a voltage drop across the LCL filter (not shown).

In operation S400, the data processing system 100 may estimate the grid voltage vector angle $\theta_g$, generate the Pulse Width Modulation (PWM) signals to control power switches of the AFE inverter 500 based on the estimated grid voltage vector angle $\theta_g$. Operation S400 is discussed in greater detail below with reference to the sub-operations illustrated in FIG. 4.

For example, the voltage sensorless position detecting module 110 may estimate the grid voltage vector angle $\theta_g$ defined as the d-axis orientation of the rotating dq-axis frame without using physical voltage sensors attached to the AC grid terminals 400. Thereafter, the data processing system 100 may generate the Pulse Width Modulation (PWM) signals to control the power switches of the AFE inverter 500 based on the estimated grid voltage vector angle $\theta_g$.

Details on the operation of the data processing system 100 including the estimation of the grid voltage vector angle $\theta_g$ by the voltage sensorless position detecting module 110, and the generation of the PWM signals based thereon will be discussed below with reference to FIGS. 3 to 11.

In operation S500, the AFE inverter 500 may supply/consume power to/from the AC grid 400 to regulate the DC bus voltage. For example, the AFE inverter 500 may consume power from the AC grid 400 when the DC bus voltage is less than the reference DC bus voltage $V_{dc}*$. Alternatively, the AFE inverter 500 may supply power back to the AC grid 400 when the DC bus voltage is greater than the reference DC bus voltage $V_{dc}*$.

The AFE inverter 500 may include power electronics, such as switching semiconductors to generate, modify and/or control the PWM signals or other alternating current signals (e.g., pulse, square wave, sinusoidal, or other waveforms) applied to the DC bus to operate the load 800.

In operation S600, the inverter 600 may supply/consume electric power to/from the load 700. For example, the inverter 600 may supply the electric power to the load 700. In this case, the inverter 600 draws power from the DC bus. Alternatively, the inverter 600 may also consume mechanical power from the load 700, when the load 700 is running as a generator. In this case, the inverter 600 supplies electric power to the DC bus.

The inverter 600 may include power electronics, such as switching semiconductors to generate, modify and control pulse-width modulated signals or other alternating current signals (e.g., pulse, square wave, sinusoidal, or other waveforms) applied to the load 700. A separate PWM generation module provides inputs to a driver stage within the inverter 600. An output stage of the inverter 600 provides the pulse-width modulated voltage waveform or other voltage signal to control the load 700. In an example embodiment, the inverter 600 is powered by the direct current (dc) voltage bus voltage $V_{dc}$.

In operation S700, the load 700 may consume power from the inverter 600. In this case, the inverter 600 consumes power from the DC bus. Alternatively, the load 700 may also supply power to the inverter 600 and the inverter 600 may supply the power back to the DC bus, when the load 700 runs as a generator.

Figure 3:
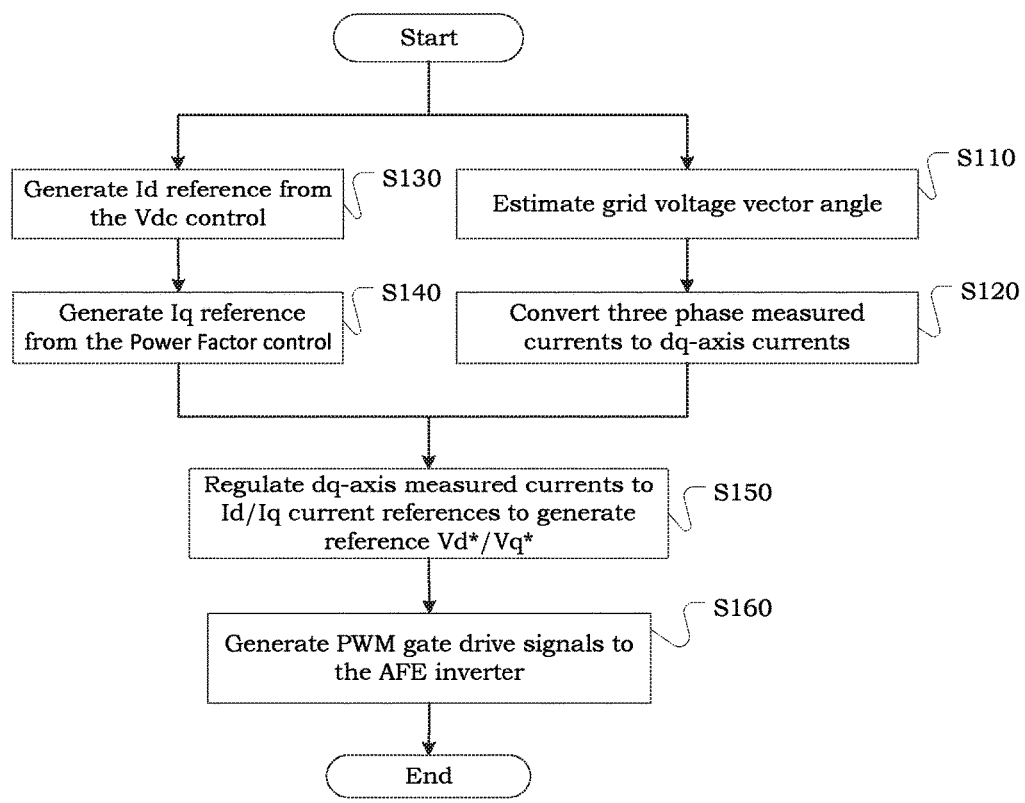
FIG. 3 illustrates a method of operating a controller to perform a voltage sensorless position detecting in a system according to some example embodiments.

FIG. 3 illustrates a method of operating a controller to perform a voltage sensorless position detecting in a system according to some example embodiments.

Referring to FIGS. 1 to 3, in operation S400 illustrated in FIG. 2, the data processing system 100 may estimate the grid voltage vector angle $\theta_g$, and generate the Pulse Width Modulation (PWM) signals to control the power switches of the AFE inverter 500 based on the estimated grid voltage vector angle $\theta_g$ by performing operations S110 to S160, discussed below.

In operation S110, the voltage sensorless position detecting module 110 may receive the power switch status information from the AFE inverter 500 when inverter switching is enabled, receive the detected phase voltage zero-crossing signals from the AFE inverter 500 when the inverter switching is disabled, and estimate the grid voltage vector angle $\theta_g$ defined as the d-axis orientation of the rotating dq-axis based thereon without using physical voltage sensors attached to the AC grid terminals 400. Therefore, the bulky and costly external voltage sensors can be removed from the AFE control system. Operation S110 will be discussed in more detail below with reference to FIGS. 4 to 11.

In operation S120, the abc/dq Transformation Module 120 may receive the 3-phase grid currents $I_c$, $I_b$, $I_a$ and perform the Clarke/Park transformation (abc-to-dq) based on the estimated grid voltage vector angle $\theta_g$ to convert the 3-phase grid currents into the q-axis current $I_q$ and the d-axis current $I_d$ in the dq rotating reference frame.

The dq axis current may refer to the direct axis current and the quadrature axis current in the dq rotating reference frame as applicable in the context of vector-controlled alternating current machines, such as the load 700.

The abc/dq Transformation Module 120 may apply a Clarke transformation and a Park transformation or other conversion equations (e.g., certain conversion equations that are suitable and are known to those of ordinary skill in the art) to convert the measured three-phase representations of current into two-phase representations of current based on the current data $I_a$, $I_b$, and $I_c$ and the estimated grid voltage vector angle $\theta_g$.

In operation S130, the PI controller 130 may receive a difference between the measured DC bus voltage $V_{dc}$ and a reference DC bus voltage $V_{dc}*$, and may generate the d-axis current reference $I_d*$ based on the difference between the detected DC bus voltage $V_{dc}$ and the reference DC bus voltage $V_{dc}*$. The PI controller is a closed loop proportional-integral controller used for the measured DC bus voltage $V_{dc}$ to track the reference DC bus voltage $V_{dc}*$.

In operation S140, the reactive power control module 140 may generate the q-axis reference current $I_q*$ based on a reference power factor PF* received from a high-level system control unit (not shown). The reference power factor PF* may be empirically determined for the system 1000 based on users' system control requirements. The q-axis reference current $I*_q$ is generated to assure the system 1000 is satisfying the requirement on the reference power factor PF* with the determined d-axis current reference $I*_d$ from the operation S140.

In operation S150, the current regulation controller 150 may utilize the d-axis current reference $I*_d$ and the q-axis reference current $I*_q$ as reference currents to generate the dq axis reference voltage $V*_d$ and $V*_q$. For example, the current regulation controller 150 may receive the difference between $I_q$ and $I*_q$, and the difference between $I_d$ and $I*_d$, and may generate dq axis reference voltage $V*_d$ and $V*_q$ therefrom. The current regulation controller 150 may include two closed loop PI controllers along with a dq-axis cross-coupling decoupling module to track the d-axis current $I_d$ and the q-axis current $I_q$ to their respective references $I_d*$ and $I_q*$. The outputs from the d-axis current regulator and q-axis current regulator are the d-axis reference voltage $V*_d$ and q-axis reference voltage $V*_q$.

In operation S160, the PWM generation module 160, may receive the dq axis reference voltage $V*_d$ and $V*_q$ in the dq rotating reference frame from the current regulation controller 150, and convert dq axis reference voltage $V*_d$ and $V*_q$ in the dq rotating reference frame to an a-axis voltage command $v_\alpha*$ and a β-axis voltage command $v_\beta*$ in the α-β stationary frame based on the estimated grid voltage vector angle $\theta_g$, and then convert the α-axis voltage command $v_\alpha*$, and β-axis voltage command $v_\beta*$ from two phase data representations into three-phase data representations (e.g., three-phase representations, such as PWM duty A, duty B and duty C for three phases). The PWM generation module 160 may generate the three phase power switch gate signals for the gate drive control of the inverter power switches of the AFE inverter 500 based on the three-phase PWM duty representations.

In operation S170, the grid voltage vector angle compensation module 170 may process the estimated grid voltage vector angle $\theta_g$ to generate a refined estimated grid voltage vector angle $\theta_g'$ by extrapolating the estimated grid voltage vector angle $\theta_g$ by one and half control periods using the PLL generated frequency to compensate for a delay associated with the digital processing. Thereafter, the PWM generation module 160 may use the refined estimated grid voltage vector angle $\theta_g'$ to convert the dq axis reference voltage $V^*_d$ and $V^*_q$ to the α-β voltage commands $v_α^*$, and $v_β^*$ in the α-β reference frame.

Figure 4:
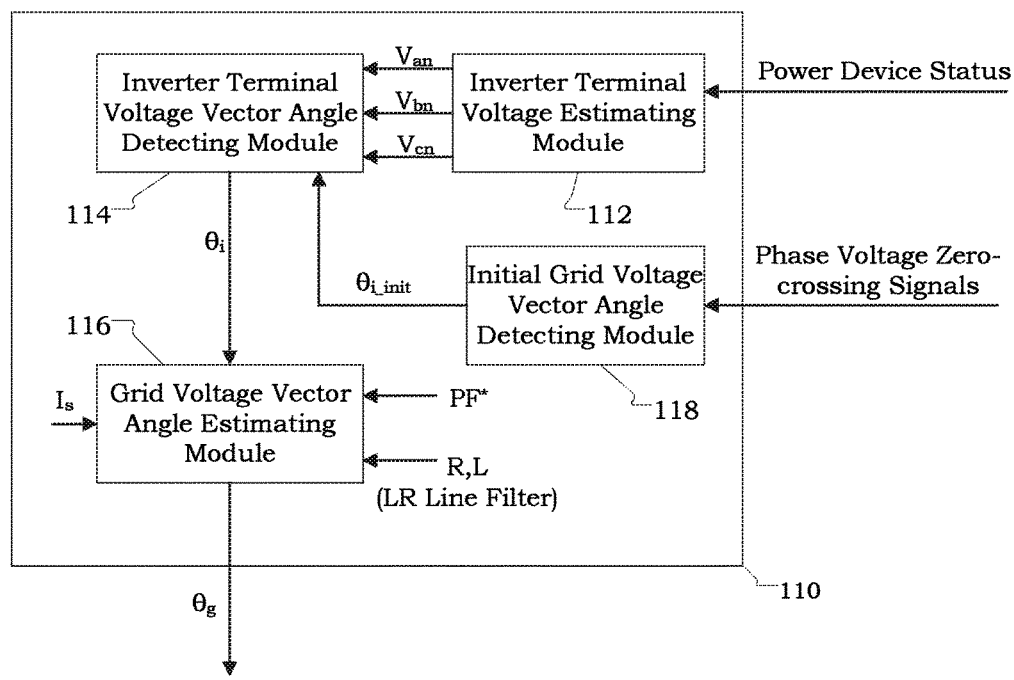
FIG. 4 illustrates a voltage sensorless position detecting module according to some example embodiments.
Figure 5:
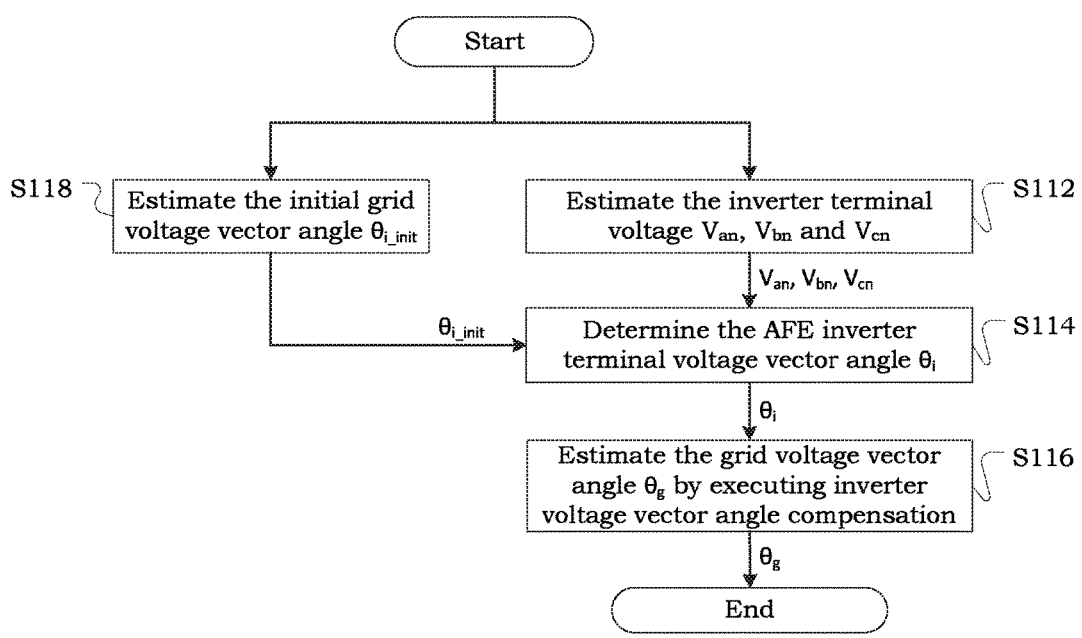
FIG. 5 illustrates a method of operating a voltage sensorless position detecting module according to some example embodiments.

FIG. 4 illustrates a voltage sensorless position detecting module according to some example embodiments, and FIG. 5 illustrates a method of operating a voltage sensorless position detecting module according to some example embodiments.

Referring to FIGS. 4 and 5, the voltage sensorless position detecting module 110 may include an inverter terminal voltage estimating module 112, an inverter terminal voltage vector angle detecting module 114, a grid voltage vector angle estimating module 116, and an initial grid voltage vector angle detecting module 118.

In operation S110 illustrated in FIG. 3, the voltage sensorless position detecting module 110 of the data processing system 100 may estimate the grid voltage vector angle $\theta_g$ by performing operations S112 to S118 illustrated in FIG. 5, discussed below.

In operation S112, the inverter terminal voltage estimating module 112 may estimate the inverter terminal voltages Van, Vbn and Vcn based on the power switch status information (or, alternatively, ON/OFF status signals) and a diode voltage drop across the power switches from the AFE inverter 500. Operation S112 will be discussed below in more detail with reference to FIG. 6.

In operation S114, the inverter terminal voltage vector angle detecting module 114 may generate the inverter terminal voltage vector angle $\theta_i$ based on the inverter terminal voltages Van, Vbn and Vcn received from the inverter terminal voltage estimating module 112 and the initial inverter voltage vector angle $\theta_{i\_init}$. The inverter terminal voltage vector angle detecting module 114 may include a Proportional and Integration (PI) controller (see FIG. 7) to regulate the position error to force the q-axis voltage $V_q$ in the dq rotating reference frame to 0 such that the output of the PI controller will be the inverter terminal voltage vector angular frequency co. Operation S114 will be discussed below in more detail with reference to FIGS. 7 and 8.

In operation S116, the grid voltage vector angle estimating module 116 may estimate the grid voltage vector angle $\theta_g$ without using physical voltage sensors based on the inverter terminal voltage vector angle $\theta_i$ received from the inverter terminal voltage vector angle detecting module 114. Operation S116 will be discussed below in more detail with reference to FIG. 9.

As discussed above, the grid voltage vector angle estimating module 116 may provide the estimated grid voltage vector angle $\theta_g$ to the abc/dq Transformation Module 120, and the abc/dq Transformation Module 120 may use the estimated grid voltage vector angle $\theta_g$ to perform abc-to-dq transformation on the 3-phase grid currents $I_a$, $I_b$ and $I_c$ to convert the 3-phase grid currents $I_a$, $I_b$ and $I_c$ into the q-axis current $I_q$ and the d-axis current $I_d$ in the dq rotating reference frame.

In operation S118, the initial grid voltage vector angle detecting module 118 may receive phase voltage zero-crossing signals from the AFE inverter 500, and may generate an initial inverter voltage vector angle $\theta_{i\_init}$ to initialize the Phase Locked Loop (PLL) controller in the inverter terminal voltage phase angle detecting module 114. Therefore, the PLL controller may start with the correct initial inverter terminal voltage vector angle $\theta_{i\_init}$. In the inverter terminal voltage vector angle detecting module 114, the PLL controller is utilized to detect the inverter terminal voltage vector angle $\theta_i$. Operation S118 will be discussed below in more detail with reference to FIG. 10.

Figure 6:
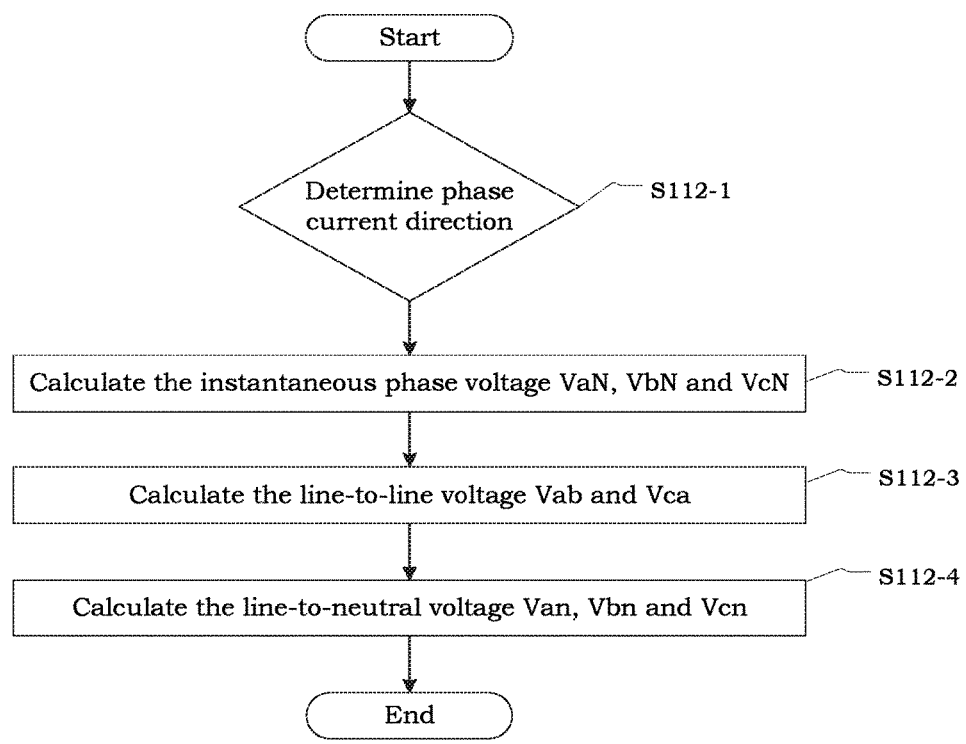
FIG. 6 illustrates a method of estimating the inverter terminal voltage according to some example embodiments.
Figure 12:
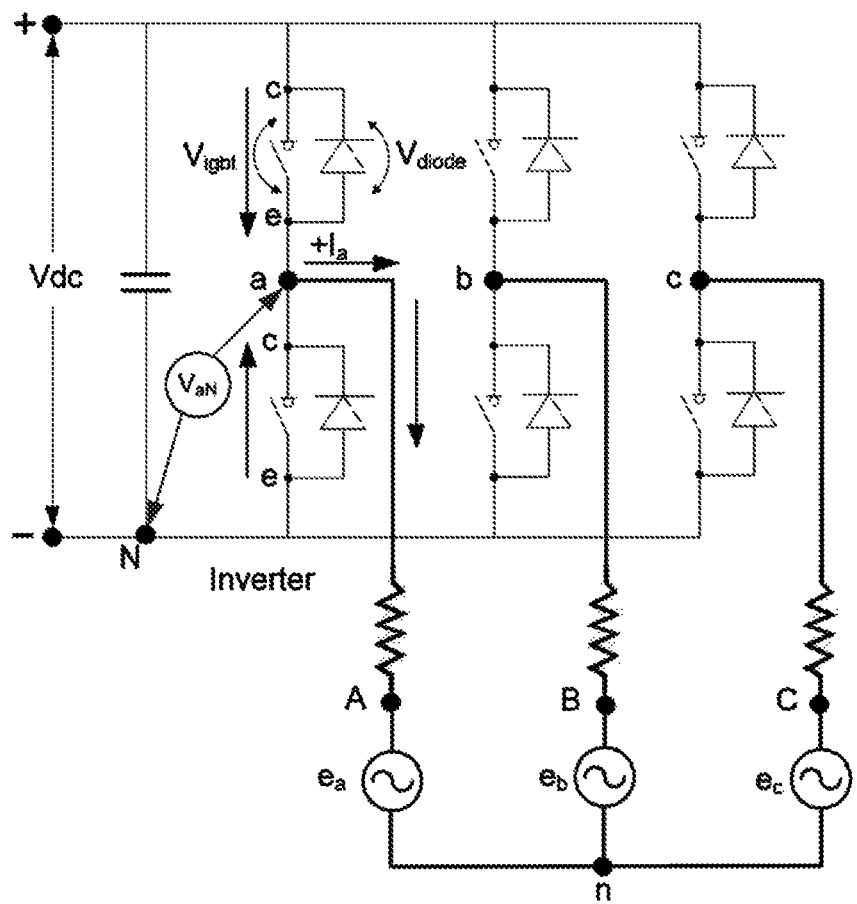
FIG. 12 is a circuit diagram illustrating an AFE inverter connected to a load according to some example embodiments.

FIG. 6 illustrates a method of estimating the inverter terminal voltage according to some example embodiments, and FIG. 12 is a circuit diagram illustrating an AFE inverter connected to a load according to some example embodiments.

Referring to FIGS. 1 to 6 and 12, in operation S112-1, the inverter termination voltage estimating module 112 may determine the phase current direction based on the power switch status information. For an example, the direction of the phase A current is defined as positive direction (+Ia) when the phase A top switch (see FIG. 12) is ON.

In operation S112-2, the inverter termination voltage estimating module 112 may calculate the instantaneous phase voltage $V_{aN}$, $V_{bN}$ and $V_{cN}$ using the following equations.

If the phase current $I_x$ (subscript 'X' represents phase a, b or c) is positive (the case illustrated in FIG. 12), the following instantaneous $V_{XN}$ (subscript 'X' represents phase a, b or c) values can be calculated:

$$V_{XN}=(Vdc-V_{igbt})=\text{Top switch ON} \qquad \text{Eq. 1}$$

OR $$V_{XN}=(-V_{diode})=\text{Top switch OFF}$$

If phase current $I_x$ is negative, the following instantaneous $V_{XN}$ values can be calculated:

$$V_{XN}=(Vdc+V_{igbt})=\text{Bottom switch OFF} \qquad \text{Eq. 2}$$

OR $$V_{XN}=(+V_{diode})=\text{Bottom switch ON}$$

In operation S112-3, the inverter termination voltage estimating module 112 may calculate the line-to-line voltage $V_{ab}$ between terminal a and terminal b of the AFE inverter 500 and $V_{ca}$ between terminal c and terminal a of the AFE inverter 500 using the following equations:

$$V_{ab} = V_{aN} - V_{bN} \qquad \text{Eq. 3}$$
$$V_{ca} = V_{cN} - V_{aN}$$

The voltage $V_{XN}$ (subscript 'X' represents phase a, b or c) in equation 3 between the AFE inverter terminal X and a negative rail of the DC bus is estimated by examining the inverter power switch collector to emitter voltages.

However, the line-to-line voltages $V_{ab}$ and $V_{ca}$ are just one example of line-to-line voltages, and the inverter termination voltage estimating module 112 may calculate other line-to-line voltages between various terminals of the AFE inverter 500.

In operation S112-4, the inverter termination voltage estimating module 112 may calculate the line-to-neutral voltage Van, Vbn and Vcn using the following equations:

$$V_{an} = \frac{1}{3}(V_{ab} - V_{ca})$$ Eq. 4

$$V_{bn} = -\frac{1}{3}(2V_{ab} + V_{ca})$$

$$V_{cn} = \frac{1}{3}(V_{ab} + 2V_{ca})$$

Therefore, the inverter voltage vector angle $\theta_i$ can be estimated in operation S114 using the line-to-neutral voltage $V_{an}$, $V_{bn}$ and $V_{cn}$. Therefore, in one or more example embodiments, the system 1000 can detect the inverter terminal voltages $V_{an}$, $V_{bn}$ and $V_{cn}$ without using physical voltage sensors at the terminals of the AC grid 400.

Figure 7:
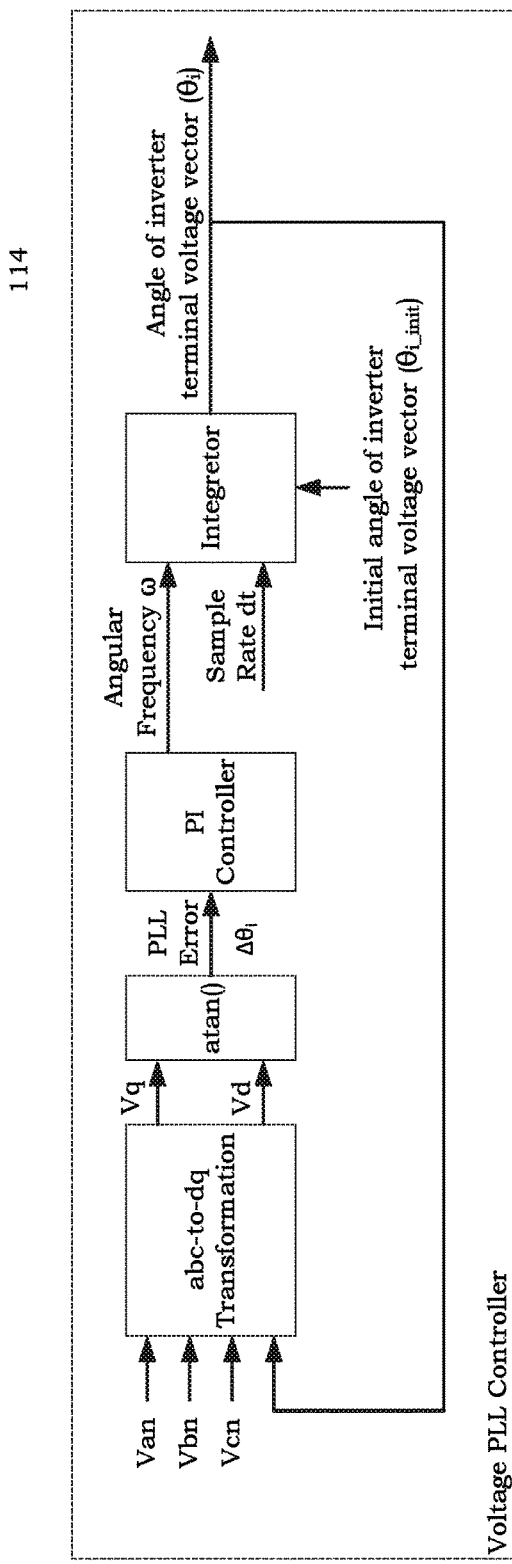
FIG. 7 illustrates a block diagram of an inverter terminal voltage vector angle detecting module included in a voltage sensorless position detecting module according to some example embodiments.
Figure 8:
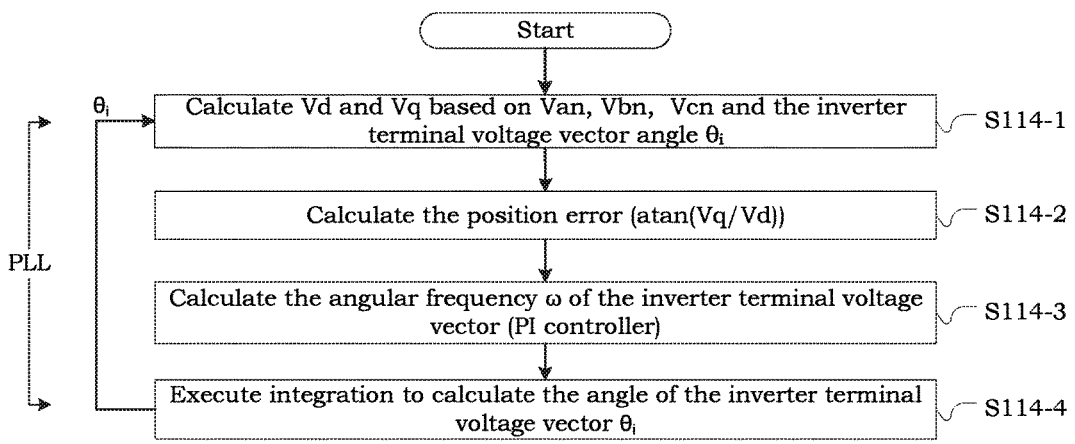
FIG. 8 illustrates a method of estimating the inverter terminal voltage vector angle according to some example embodiments.

FIG. 7 illustrates a block diagram of an inverter terminal voltage vector angle detecting module 114 and FIG. 8 illustrates a method of estimating the inverter terminal voltage vector angle according to some example embodiments.

Referring to FIGS. 1 to 5, 7 and 8, in operation S114-1, the inverter terminal voltage vector angle detecting module 114 may calculate the d-axis voltage $V_d$ and the q-axis voltage $V_q$ in the rotating dq reference frame based on the inverter terminal line-to-neutral voltage $V_{an}$, $V_{bn}$, $V_{cn}$ and the inverter terminal voltage vector angle $\theta_i$ using the Park transformation in the following equation:

$$V_\alpha = \frac{2}{3}V_{an} - \frac{1}{3}(V_{bn} - V_{cn})$$ Eq. 5

$$V_\beta = \frac{2}{\sqrt{3}}(V_{bn} - V_{cn})$$

$$V_d = V_\alpha \cdot \cos(\theta_i) + V_\beta \cdot \sin(\theta_i)$$

$$V_q = V_\beta \cdot \cos(\theta_i) - V_\alpha \cdot \sin(\theta_i)$$

In operation S114-2, the inverter terminal voltage vector angle detecting module 114 may calculate a position error $\Delta\theta_i$. The inverter terminal voltage vector angle detecting module 114 may calculate the position error $\Delta\theta_i$ using the following Equation:

$$\Delta\theta_i = \operatorname{atan}\left(\frac{V_q}{V_d}\right)$$ Eq. 6

In operation S114-3, the inverter terminal voltage vector angle detecting module 114 calculate the phase angular frequency $\omega$ based on the position error $\Delta\theta_i$.

For example, the inverter terminal voltage vector angle detecting module 114 may use a PI controller to regulate the position error $\Delta\theta_i$ to force the q-axis voltage $V_q$ to 0, which means the d-axis in the rotating dq reference frame will be forced to align to the grid voltage vector, so the output of the PI controller is the grid voltage vector angular frequency $\omega$.

In operation S114-4, the inverter terminal voltage vector angle detecting module 114 may utilize the following equation to calculate the angle $\theta_i$ of the inverter voltage vector $u_s$:

$$\theta_i = \int_0^t \omega \cdot dt + \theta_{i\_init}$$ Eq. 7

Thereafter, the inverter terminal voltage vector angle detecting module 114 may return to operation S114-1, and recalculate the d-axis voltage $V_d$ and the q-axis voltage $V_q$ such that operations S114-1 to S114-4 are performed iteratively in a phase locked loop (PLL) to reach a convergence.

Operations S114-1 to S114-4 are illustrated in FIG. 7 in block diagram form.

Figure 9:
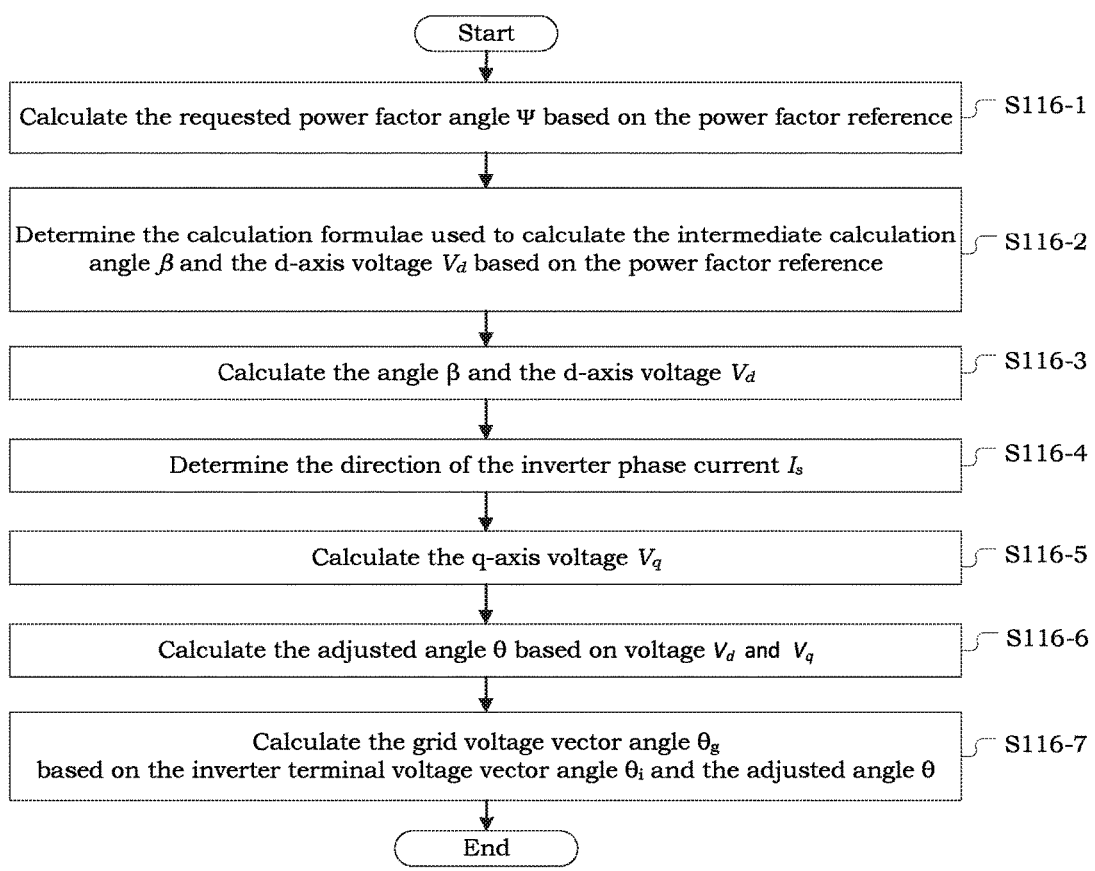
FIG. 9 illustrates a method of estimating the grid voltage vector angle according to some example embodiments.

FIG. 9 illustrates a method of estimating the grid voltage vector angle $\theta_g$ according to some example embodiments. FIGS. 11A to 11C are vector diagrams illustrating current and voltage vectors in the dq rotating reference frame according to some example embodiments.

Referring to FIGS. 11A to 11C, in FIGS. 11A to 11C, $\Delta v$ is a voltage vector difference between an inverter terminal voltage vector $u_s$ at a terminal of the AFE inverter 500, and the grid voltage vector $u_g$ at a terminal of the AC grid 400, i.e., $\Delta v = u_s - u_g$. The angle $\beta$ is an angle between a q-axis voltage vector $V_q$ and the voltage vector difference $\Delta v$; the angle $\alpha$ is an angle between a d-axis voltage vector $V_d$ and a vector $j\omega L i_s$. In FIGS. 11A to 11C, the angles $\alpha$ and $\beta$ are used as intermediate calculation angles to calculate an adjusted angle $\theta$ representing the difference between $\theta_i$ and $\theta_g$, and the angle $\psi$ is a power factor angle. The angles $\Psi$, $\beta$ and $\alpha$ are defined as below:

$$\psi = \cos^{-1}(|PF^*|)$$ Eq. 8

$$\alpha = \frac{\pi}{2} - \psi$$

$$0 <= \beta <= \frac{\pi}{2}$$

The reference power factor PF* is defined such that the reference power factor PF* is based on the signed magnitude $I_s$ of an AFE inverter phase current reference vector $i_s$, and the phase of the AFE inverter phase current reference vector $i_s$ relative to the grid terminal voltage vector $u_g$.

For example, as shown in graph B1 of FIG. 11B and graph C1 of FIG. 11C, the reference power factor PF* may have a positive value when either (i) the signed magnitude $I_s$ is positive and the inverter phase current vector $i_s$ leads the grid terminal voltage vector $u_g$ or (ii) the signed magnitude $I_s$ is negative and the inversed inverter phase current vector $-i_s$ leads the grid terminal voltage vector $u_g$.

Further, as shown in graph B2 of FIG. 11B and graph C2 of FIG. 11C, the reference power factor PF* may have a negative value when either (i) the signed magnitude $I_s$ is positive and the inverter phase current vector $i_s$ lags the grid terminal voltage vector $u_g$ or (ii) the signed magnitude $I_s$ is negative and the inversed inverter phase current vector $-i_s$ lags the grid terminal voltage vector $u_g$.

Further still, the reference power factor PF* may have a zero value when the inverter phase current vector $i_s$ is perpendicular to the grid terminal voltage vector $u_g$ by 90 degrees, and may have an absolute value of 1 when the inverter phase current vector $i_s$ (or, alternatively, the inversed inverter phase current vector $-i_s$) is aligned with the grid terminal voltage vector $u_g$. Therefore, since $0<=|PF^*|<=1$, $$0 =< \psi <= \frac{\pi}{2} \qquad \text{Eq. 9}$$

In FIG. 11A, since the absolute value of the reference power factor PF* is 1, the AFE inverter 500 supplies/consumes power to/from the AC grid 400 at a unity reference power factor PF*. In graph A1, the AFE inverter 500 supplies power to the AC grid 400. In graph A2, the AFE inverter 500 consumes power from the AC grid 400. In both cases, the power factor angle ψ equals 0 (Is>0 and Is<0) and the angle α is:

$$\alpha = \frac{\pi}{2} - \psi = \frac{\pi}{2} - 0 = \frac{\pi}{2} \qquad \text{Eq. 10}$$

In the following equations, R and L are the resistance and inductance values of the LR line filter 300, respectively; $I_s$ is the signed magnitude of an AFE inverter phase current reference vector $i_s$.

$$I_s = \begin{cases} \text{sign}(I_d^*) \cdot \sqrt{(I_d^*)^2 + (I_q^*)^2}, & \text{when } I_d^* \neq 0 \\ -\text{sign}(I_q^*) \cdot \sqrt{(I_d^*)^2 + (I_q^*)^2}, & \text{when } I_d^* = 0 \end{cases} \qquad \text{Eq. 11}$$

where $I_d^*$ is the d-axis current reference generated from the PI controller 130 and $I_q^*$ is the q-axis current reference generated from the reactive power control module 140.

From graph A1, when ($I_s$>0 & |PF*|=1), β, $V_d$ and $V_q$ can be calculated using the following equations:

$$\beta = \tan^{-1}(R/\omega L) \qquad \text{Eq. 12}$$

$$V_d =$$
$$u_g + I_s \cdot R = u_g + \Delta v \cdot \sin(\beta) = \mu_g + \sin(\beta) \cdot I_s \cdot \sqrt{R^2 + (\omega \cdot L)^2}$$
$$V_q = \omega \cdot L \cdot I_s = \Delta v \cdot \cos(\beta) = \cos(\beta) \cdot I_s \cdot \sqrt{R^2 + (\omega \cdot L)^2}$$

From graph A2, when ($I_s$<0 & |PF*|=1), β, $V_d$ and $V_q$ can be calculated using the following equations:

$$\beta = \tan^{-1}(R/\omega L) \qquad \text{Eq. 13}$$
$$V_d = u_g - |I_s| \cdot R = u_g - \Delta v \cdot \sin(\beta) = u_g - \sin(\beta) \cdot$$
$$|I_s| \cdot \sqrt{R^2 + (\omega \cdot L)^2}$$
$$= u_g + \sin(\beta) \cdot I_s \cdot \sqrt{R^2 + (\omega \cdot L)^2}$$
$$V_q = -\omega \cdot L \cdot |I_s| = -\Delta v \cdot \cos(\beta) = -\cos(\beta) \cdot |I_s| \cdot$$
$$\sqrt{R^2 + (\omega \cdot L)^2}$$
$$= \cos(\beta) \cdot I_s \cdot \sqrt{R^2 + (\omega \cdot L)^2}$$

In FIG. 11B, the AFE inverter 500 supplies power to the AC grid 400 at a non-unity reference power factor PP. In graph B1, the reference power factor PF* is greater than 0, and the inverter current vector $i_s$ leads the grid voltage vector $u_g$. In graph B2, the reference power factor PF* is less than 0, and the grid voltage vector $u_g$ leads the inverter current vector $i_s$.

From graph B1, when ($I_s$>0 & PF*>0), β, $V_d$ and $V_q$ can be calculated using the following equations:

$$\beta = (\pi/2 - \alpha) - \tan^{-1}(R/\omega L) = \psi - \tan^{-1}(R/\omega L) \qquad \text{Eq. 14}$$
$$V_d = u_g - \Delta v \cdot \sin(\beta) = u_g - \sin(\beta) \cdot I_s \cdot \sqrt{R^2 + (\omega \cdot L)^2}$$
$$V_q = \Delta v \cdot \cos(\beta) = \cos(\beta) \cdot I_s \cdot \sqrt{R^2 + (\omega \cdot L)^2}$$

From graph B2, when ($I_s$>0 & PF*<0), β, $V_d$ and $V_q$ can be calculated using the following equations:

$$\beta = (\pi/2 - \alpha) + \tan^{-1}(R/\omega L) = \psi + \tan^{-1}(R/\omega L) \qquad \text{Eq. 15}$$
$$V_d = u_g + \Delta v \cdot \sin(\beta) = u_g + \sin(\beta) \cdot I_s \cdot \sqrt{R^2 + (\omega \cdot L)^2}$$
$$V_q = \Delta v \cdot \cos(\beta) = \cos(\beta) \cdot I_s \cdot \sqrt{R^2 + (\omega \cdot L)^2}$$

In FIG. 11C, the AFE inverter 500 consumes power from the AC grid 400 at a non-unity reference power factor PF*. In graph C1, the reference power factor PF* is greater than 0, and the reversed inverter current vector is leads the grid voltage vector $u_g$. In graph C2, the reference power factor PP is less than 0, and the grid voltage vector $u_g$ leads the reversed inverter current vector $i_s$.

From graph C1, when ($I_s$<0 & PF*>0), $V_d$ and $V_q$ can be calculated using the following equations:

$$\beta = (\pi/2 - \alpha) - \tan^{-1}(R/\omega L) = \psi - \tan^{-1}(R/\omega L) \qquad \text{Eq. 16}$$
$$V_d = u_g + \Delta v \cdot \sin(\beta) = u_g + \sin(\beta) \cdot |I_s| \cdot \sqrt{R^2 + (\omega \cdot L)^2}$$
$$= u_g - \sin(\beta) \cdot I_s \cdot \sqrt{R^2 + (\omega \cdot L)^2}$$
$$V_q = -\Delta v \cdot \cos(\beta) = -\cos(\beta) \cdot |I_s| \cdot \sqrt{R^2 + (\omega \cdot L)^2}$$
$$= \cos(\beta) \cdot I_s \cdot \sqrt{R^2 + (\omega \cdot L)^2}$$

From graph C2, when ($I_s$<0 & PF*<0), $V_d$ and $V_q$ can be calculated using the following equations:

$$\beta = (\pi/2 - \alpha) + \tan^{-1}(R/\omega L) = \psi + \tan^{-1}(R/\omega L) \qquad \text{Eq. 17}$$
$$V_d = u_g - \Delta v \cdot \sin(\beta) = u_g - \sin(\beta) \cdot |I_s| \cdot \sqrt{R^2 + (\omega \cdot L)^2}$$
$$= u_g + \sin(\beta) \cdot I_s \cdot \sqrt{R^2 + (\omega \cdot L)^2}$$
$$V_q = -\Delta v \cdot \cos(\beta) = -\cos(\beta) \cdot |I_s| \cdot \sqrt{R^2 + (\omega \cdot L)^2}$$
$$= \cos(\beta) \cdot I_s \cdot \sqrt{R^2 + (\omega \cdot L)^2}$$

As discussed in more detail below with reference to FIG. 9, based on analysis above for all cases in FIGS. 11A to 11C, the grid voltage vector angle estimating module 116 may select different ones of the following equations to calculate the adjusted angle θ from the AFE inverter 500 terminal to the AC grid 400 terminal:

$$\psi = \cos^{-1}(|PF^*|) \qquad \text{Eq. 18}$$

-continued $$\begin{cases} \beta = \psi - \tan^{-1}(R/\omega L), & \text{when } 1 > PF^* >= 0 \\ \beta = \psi + \tan^{-1}(R/\omega L), & \text{when } |PF^*| = 1 \text{ or} \\ & -1 < PF^* < 0 \end{cases}$$

$$\begin{cases} V_d = u_g - \sin(\beta) \times I_s \times \\ \sqrt{R^2 + (\omega L)^2}, & \text{when } 1 > PF^* >= 0 \\ V_d = u_g + \sin(\beta) \times I_s \times \\ \sqrt{R^2 + (\omega L)^2}, & \text{when } |PF^*| = 1 \text{ or} \\ & -1 < PF^* < 0 \end{cases}$$

$$V_q = \cos(\beta) \times I_s \times \sqrt{R^2 + (\omega L)^2}$$

$$\theta = -\tan^{-1}\left(\frac{V_q}{V_d}\right)$$

Therefore, the compensated position considering phase shift between the inverter terminal voltage vector angle $\theta_i$ and the grid voltage vector angle $\theta_g$ can be calculated using the following equation:

$$\theta_g = \theta_i + \theta \qquad \text{Eq. 19}$$

Referring to FIGS. 1 to 5, 9 and 11A to 11C, using various ones of Equations 18 and 19, discussed above, the grid voltage vector angle estimating module 116 may calculate the grid voltage vector angle $\theta_g$.

In operation S116-1, the grid voltage vector angle estimating module 116 may calculate the requested power factor angle $\Psi$ based on the reference power factor PF* using the following Equation:

$$\Psi = \cos^{-1}(|PF^*|). \qquad \text{Eq. 20}$$

In operation S116-2, the grid voltage vector angle estimating module 116 may determine whether the absolute value of the reference power factor PF* is equal to 1 or whether the reference power factor PF* is less than zero, and the grid voltage vector angle estimating module 116 will use this information about the reference power factor PF* to determine which of the equations included in Equation 18 will be used to calculate the intermediate calculation angle β and the d-axis voltage $V_d$.

In operation S116-3, the grid voltage vector angle estimating module 116 may calculate the intermediate calculation angle β based on the power factor angle $\Psi$ determined in operation S116-1, the grid voltage vector angular frequency ω calculated in operation S114, and known line filter parameters L and R, which are the inductance and resistance values of the LR line filter 300, respectively. Further, the grid voltage vector angle estimating module 116 may calculate the d-axis voltage $V_d$ based on the intermediate calculation angle β, the line filter parameters R and L, the grid voltage vector angular frequency ω calculated in operation S114, the signed magnitude of the AFE inverter phase current vector reference is, and a magnitude of the grid voltage vector $u_g$.

The grid voltage vector angle estimating module 116 may calculate the angle β and d-axis voltage $V_d$ using different ones of the equations included in Equation 18 based on the reference power factor PF*.

For example, if the absolute value of the reference power factor PF* is equal to 1 or the reference power factor is less than zero, the grid voltage vector angle estimating module 116 may determine the angle β and $V_d$ using the following equations:

$$\beta = \psi + \tan^{-1}(R/\omega L) \qquad \text{Eq. 20}$$

$$V_d = u_g + \sin(\beta) \times I_s \times \sqrt{R^2 + (\omega L)^2}$$

Alternatively, if the absolute value of the reference power factor PF* is not equal to 1 or the reference power factor PF* is greater than or equal to zero, the grid voltage vector angle estimating module 116 may determine the angle β and $V_d$ using the following two equations:

$$\beta = \psi - \tan^{-1}(R/\omega L) \qquad \text{Eq. 21}$$

$$V_d = u_g - \sin(\beta) \times I_s \times \sqrt{R^2 + (\omega L)^2}$$

In operation S116-4, the grid voltage vector angle estimating module 116 may determine the direction of the inverter phase current $I_s$ based on the direction of the d-axis current $I_d$ and the q-axis current $I_q$. When $I_d$ is not 0, the direction of $I_s$ is same as the direction of $I_d$; when $I_d$ is 0, the direction of $I_s$ is inverse direction of $I_q$.

In operation S116-5, the grid voltage vector angle estimating module 116 may calculate the q-axis voltage $V_q$ based on the angle β determined in operation S116-3, the line filter parameters L and R, the grid voltage vector angular frequency ω calculated in operation S114, and the magnitude of the AFE inverter phase current vector reference L. For example, the grid voltage vector angle estimating module may calculate $V_q$ using the following Equation:

$$V_q = \cos(\beta) \times I_s \times \sqrt{R^2 + (\omega L)^2} \qquad \text{Eq. 22}$$

In operation S116-6, the grid voltage vector angle estimating module 116 may calculate the adjusted angle θ based on the d-axis voltage $V_d$ and q-axis voltage $V_q$ using the equation in Equation 18.

In operation S116-7, the grid voltage vector angle estimating module 116 may calculate the grid voltage vector angle $\theta_g$ based on the adjusted angle θ determined in operation S116-6 and the inverter terminal voltage vector angle $\theta_i$ determined in operation S114.

By calculating the grid terminal voltage vector angle $\theta_g$ based on the adjusted angle θ, which represents the difference between the inverter terminal voltage vector angle $\theta_i$ and the grid terminal voltage vector angle $\theta_g$, the grid terminal voltage vector angle $\theta_g$ defines the rotating dq-axis reference frame used to control of the AFE inverter 500 such that a robust DC Bus under loading condition can be maintained and the reference power factor value PF* can be achieved at the AC grid terminal 400.

Figure 10:
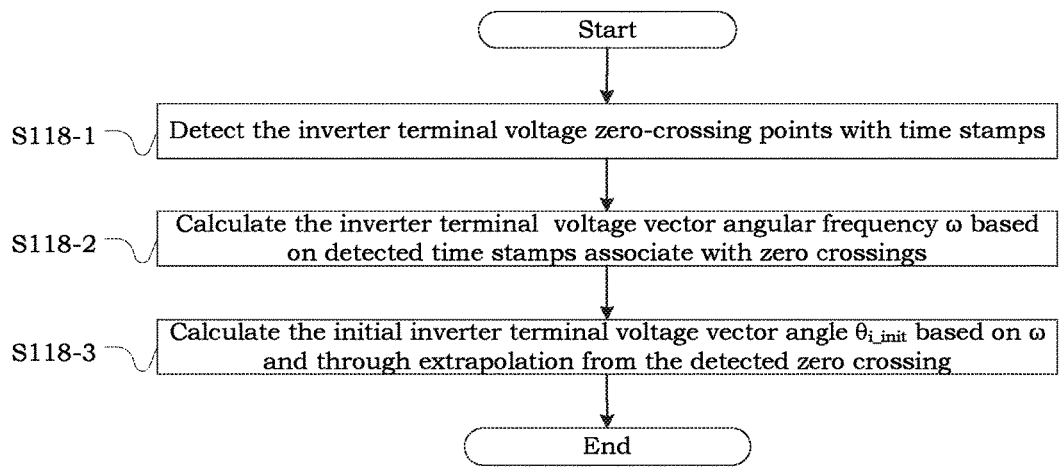
FIG. 10 illustrates a method of generating an initial terminal voltage vector angle according to some example embodiments.

FIG. 10 illustrates a method of generating an initial inverter terminal voltage vector angle according to some example embodiments.

Referring to FIGS. 1 to 5 and 10, in operation S118-1, the initial inverter terminal voltage vector angle detecting module 118 may detect the inverter terminal voltage zero-crossing instants and record the time stamps when the AFE inverter 500 is disabled. For example, a hardware device, such as a PSoC chip, can be utilized to detect the zero-crossing instants of the inverter terminal voltage $u_s$.

Based on the recorded time stamps information at each zero-crossing instant, the initial inverter terminal voltage vector angle detecting module 118 may estimate the angle $\theta_i$ of the inverter terminal voltage vector $u_s$ before the AFE inverter 500 is enabled, and use the estimated angle $\theta_i$ of the inverter terminal voltage vector $u_s$ to initialize the PLL controller.

In operation S118-2, the initial terminal voltage vector angle detecting module 118 may calculate the inverter terminal voltage angular frequency $\omega$ based on the inverter terminal voltage zero-crossing instants before the AFE inverter 500 is enabled. For example, the initial terminal voltage vector angle detecting module 118 may calculate the inverter terminal voltage angular frequency $\omega$ in rad/sec using the following Equation:

$$\omega = \pi/\Delta t, \qquad \text{Eq. 23}$$

where $\Delta t$ is the time stamp difference in seconds between two zero-crossing instants.

In operation S118-3, the initial terminal voltage vector angle detecting module 118 may calculate the initial inverter terminal voltage vector angle $\theta_{i\_init}$ based on the inverter terminal voltage angular frequency $\omega$. For example, the initial inverter terminal voltage vector angle detecting module 118 may calculate the initial inverter terminal voltage vector angle using the following Equation:

$$\theta_{i\_init} = \int_0^t \omega \cdot dt + \theta_{zero\_crossing} \qquad \text{Eq. 24}$$

where $\theta_{i\_init}$ is the calculated initial inverter terminal voltage vector angle and $\theta_{zero\_crossing}$ is the inverter terminal voltage vector angle corresponding to the most recent zero-crossing instant.

The initial terminal voltage vector angle detecting module 118 may provide the initial inverter terminal voltage vector angle $\theta_{i\_init}$ to the inverter terminal voltage vector angle detecting module 114. As discussed above, the inverter terminal voltage vector angle detecting module 114 may use the initial inverter terminal voltage vector angle $\theta_{i\_init}$ to initialize the integrator of the PLL controller in the inverter terminal voltage vector angle detecting module 114. Therefore, the PLL controller may start with the correct initial inverter terminal voltage vector angle $\theta_{i\_init}$ without using the bulkiness of sensors at the AC grid terminal 400.

Example embodiments being thus described, it will be obvious that the same may be varied in many ways. Such variations are not to be regarded as a departure from the spirit and scope of example embodiments, and all such modifications as would be obvious to one skilled in the art are intended to be included within the scope of the claims.

We claim:

1. A controller comprising:
   a memory having computer-readable instructions stored therein; and
   a processor configured to execute the computer-readable instructions to:
      estimate a synthesized grid voltage vector angle at a terminal of an alternating current (AC) grid by,
         calculating an adjusted angle based on a d-axis voltage and a q-axis voltage, the adjusted angle representing a difference between an Active Front End (AFE) inverter terminal voltage vector angle at a terminal of an AFE inverter and the synthesized grid voltage vector angle due to a voltage drop across an impedance of a filter between the terminal of the AFE inverter and the terminal of the AC grid, the d-axis voltage and the q-axis voltage representing a projection of the AFE inverter terminal voltage vector along a rotating dq-axis, the rotating dq-axis having a d-axis aligned with the synthesized grid voltage vector angle, and
         estimating the synthesized grid voltage vector angle at the terminal of the AC grid based on at least the adjusted angle such that the controller estimates the synthesized grid voltage vector angle to compensate for the voltage drop across the impedance of the filter, the synthesized grid voltage vector angle being an angle associated with a voltage vector of the terminal of the AC grid;
      generate Pulse Width Modulation (PWM) signals to control power switches of the AFE inverter based on at least the synthesized grid voltage vector angle; and
      control the AFE inverter to exchange power between the AC grid and a load based on the PWM signals.

2. The controller of claim 1, wherein the processor is configured to estimate the synthesized grid voltage vector angle at the terminal of the AC grid without using physical voltage sensors.

3. The controller of claim 1, wherein the processor is configured to calculate the adjusted angle by calculating an inverse tangent value of a quotient obtained by dividing the q-axis voltage over the d-axis voltage.

4. The controller of claim 3, wherein the filter is a line filter, and the processor is configured to calculate the d-axis voltage and the q-axis voltage based on a magnitude of grid voltage vector of the terminal of the AC grid, an intermediate angle, parameters of the line filter and a signed magnitude of an inverter phase current reference vector, the inverter phase current reference vector being constructed by a d-axis current reference and a q-axis current reference.

5. The controller of claim 4, wherein the AFE inverter is connected to the load via a DC bus, and the d-axis current reference is generated based on a difference between an actual DC bus voltage of the DC bus and a reference DC bus voltage, and the q-axis current reference is generated based on a AC grid terminal reference power factor.

6. The controller of claim 5, wherein the controller is configured to,
   calculate the d-axis current reference by comparing, using a proportional-integral (PI) controller, the actual DC bus voltage of the DC bus and the reference DC bus voltage;
   calculate the q-axis current reference to achieve the AC grid terminal reference power factor at the terminal of the AC grid based on the d-axis current reference; and
   construct the inverter phase current reference vector based on the d-axis current reference and the q-axis current reference.

7. The controller of claim 5, wherein the parameters are impedance parameters of the line filter.

8. The controller of claim 7, wherein the processor is configured to calculate the intermediate angle based on a power factor angle, the impedance parameters of the line filter, and a polarity and a magnitude of the AC grid terminal reference power factor.

9. The controller of claim 8, wherein the processor is configured to calculate the power factor angle by calculating an inverse cosine value of an absolute value of the magnitude of the AC grid terminal reference power factor.

10. The controller of claim 1, wherein:
   the AFE inverter terminal voltage vector angle includes a first AFE inverter terminal voltage vector angle and a second AFE inverter terminal voltage vector angle, the first AFE inverter terminal voltage vector angle being an angle associated with the voltage vector of the terminal of the AFE inverter at an initial time and the second AFE inverter terminal voltage vector angle being an angle associated with the voltage vector of the terminal of the AFE inverter at a second time subsequent to the initial time; and the processor is configured to estimate the synthesized grid voltage vector angle by:
estimating the first AFE inverter terminal voltage vector angle when the AFE inverter is disabled;
estimating a terminal voltage of the AFE inverter when the AFE inverter is enabled, the terminal voltage of the AFE inverter being a voltage of the terminal of the AFE inverter;
determining the second AFE inverter terminal voltage vector angle when the AFE inverter is enabled; and
estimating the synthesized grid voltage vector angle based on the adjusted angle and the second AFE inverter terminal voltage vector angle.

11. The controller of claim 10, wherein the processor is configured to estimate the second AFE inverter terminal voltage vector angle by:
initializing a phase locking loop (PLL) using the first AFE inverter terminal voltage vector angle when the AFE inverter is disabled; and
running the phase locking loop (PLL) using 3-phase line-to-neutral voltages of the terminal of the AFE inverter when the AFE inverter is enabled.

12. The controller of claim 11, wherein the processor is configured to estimate the second AFE inverter terminal voltage vector angle by running the PLL to align the second AFE inverter terminal voltage vector angle with the d-axis of the rotating dq-axis associated with the PLL.

13. The controller of claim 12, wherein, when the AFE inverter is enabled, the processor is configured to estimate the second AFE inverter terminal voltage vector angle by running the PLL to:
calculate a position error between the second AFE inverter terminal voltage vector angle and the d-axis associated with the PLL;
calculate an angular frequency of the second AFE inverter terminal voltage vector angle by using a PI controller to regulate the position error; and
estimate the second AFE inverter terminal voltage vector angle by integrating the angular frequency.

14. The controller of claim 1, wherein the processor is configured to compensate for the synthesized grid voltage vector angle by compensating for a time delay associated with digital processing to generate a compensated synthesized grid voltage vector angle, wherein
the controller is configured to generate the PWM signals to control the power switches of the AFE inverter based on the compensated synthesized grid voltage vector angle.

15. The controller of claim 1, wherein the controller is configured to control the AFE inverter by defining the rotating dq reference frame based on the synthesized grid voltage vector angle such that the d-axis of the rotating dq reference frame is aligned with the synthesized grid voltage vector angle.

16. A method comprising:
estimating a synthesized grid voltage vector angle at a terminal of an alternating current (AC) grid by,
calculating an adjusted angle based on a d-axis voltage and a q-axis voltage, the adjusted angle representing a difference between an Active Front End (AFE) inverter terminal voltage vector angle at a terminal of an AFE inverter and the synthesized grid voltage vector angle due to a voltage drop across an impedance of a filter between the terminal of the AFE inverter and the terminal of the AC grid, the d-axis voltage and the q-axis voltage representing a projection of the AFE inverter terminal voltage vector along a rotating dq-axis, the rotating dq-axis having a d-axis aligned with the synthesized grid voltage vector angle, and
estimating the synthesized grid voltage vector angle at the terminal of the AC grid based on at least the adjusted angle such that the controller estimates the synthesized grid voltage vector angle to compensate for the voltage drop across the impedance of the filter, the synthesized grid voltage vector angle being an angle associated with a voltage vector of the terminal of the AC grid;
generating Pulse Width Modulation (PWM) signals to control power switches of the AFE inverter based on at least the synthesized grid voltage vector angle; and
controlling the AFE inverter to exchange power between the AC grid and a load based on the PWM signals.

17. The method of claim 16, wherein the estimating estimates the synthesized grid voltage vector angle at the terminal of the AC grid without using physical voltage sensors.

18. The method of claim 16, wherein:
the AFE inverter terminal voltage vector angle includes a first AFE inverter terminal voltage vector angle and a second AFE inverter terminal voltage vector angle, the first AFE inverter terminal voltage vector angle being an angle associated with the voltage vector of the terminal of the AFE inverter at an initial time and the second AFE inverter terminal voltage vector angle being an angle associated with the voltage vector of the terminal of the AFE inverter at a second time subsequent to the initial time; and
the estimating the synthesized grid voltage vector angle at the terminal of the AC grid based on at least the adjusted angle estimates the synthesized grid voltage vector angle by:
estimating the first AFE inverter terminal voltage vector angle when the AFE inverter is disabled;
estimating a terminal voltage of the AFE inverter when the AFE inverter is enabled, the terminal voltage of the AFE inverter being a voltage of the terminal of the AFE inverter;
determining the second AFE inverter terminal voltage vector angle when the AFE inverter is enabled; and
estimating the synthesized grid voltage vector angle based on the adjusted angle and the second AFE inverter terminal voltage vector angle.

19. The method of claim 16, wherein the controlling controls the AFE inverter by defining the rotating dq reference frame based on the synthesized grid voltage vector angle such that the d-axis of the rotating dq reference frame is aligned with the synthesized grid voltage vector angle.

20. A controller comprising:
a memory having computer-readable instructions stored therein; and
a processor configured to execute the computer-readable instructions to:
estimate a synthesized grid voltage vector angle at a terminal of an alternating current (AC) grid, the synthesized grid voltage vector angle being an angle associated with a voltage vector of the terminal of the AC grid, and the adjusted angle representing a shift in phase angle between an Active Front End (AFE) inverter terminal voltage vector angle at a terminal of an AFE inverter and the synthesized grid voltage vector angle, the AFE inverter terminal voltage vector angle including a first AFE inverter terminal voltage vector angle and a second AFE inverter terminal voltage vector angle, the first AFE inverter terminal voltage vector angle being an angle associated with the voltage vector of the terminal of the AFE inverter at an initial time and the second AFE inverter terminal voltage vector angle being an angle associated with the voltage vector of the terminal of the AFE inverter at a second time subsequent to the initial time, and the processor is configured to estimate the synthesized grid voltage vector angle by:

estimating the first AFE inverter terminal voltage vector angle when the AFE inverter is disabled, estimating a terminal voltage of the AFE inverter when the AFE inverter is enabled, the terminal voltage of the AFE inverter being a voltage of the terminal of the AFE inverter, determining the second AFE inverter terminal voltage vector angle when the AFE inverter is enabled, and estimating the synthesized grid voltage vector angle based on the adjusted angle and the second AFE inverter terminal voltage vector angle;

generate Pulse Width Modulation (PWM) signals to control power switches of the AFE inverter based on at least the synthesized grid voltage vector angle; and control the AFE inverter to exchange power between the AC grid and a load based on the PWM signals.

* * * * *